(12) United States Patent
Pazhayaveetil et al.

(10) Patent No.: US 9,912,312 B2
(45) Date of Patent: Mar. 6, 2018

(54) BOOST CONVERTER CONTROLLER WITH INDUCTANCE VALUE DETERMINATION

(71) Applicant: Cirrus Logic, Inc., Austin, TX (US)

(72) Inventors: Ullas Pazhayaveetil, Ceder Park, TX (US); Jeffrey May, Dripping Springs, TX (US); Gautham Kamath, Austin, TX (US); John Christopher Tucker, Austin, TX (US); Christian Larsen, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 652 days.

(21) Appl. No.: 14/182,850

(22) Filed: Feb. 18, 2014

(65) Prior Publication Data

US 2015/0032396 A1    Jan. 29, 2015

Related U.S. Application Data

(60) Provisional application No. 61/858,939, filed on Jul. 26, 2013.

(51) Int. Cl.

| | | |
|---|---|---|
| *G01R 27/26* | (2006.01) | |
| *H03G 3/00* | (2006.01) | |
| *G01R 21/06* | (2006.01) | |
| *G06F 1/32* | (2006.01) | |
| *H02M 3/158* | (2006.01) | |
| *H03F 3/187* | (2006.01) | |
| *H03F 3/217* | (2006.01) | |

(52) U.S. Cl.
CPC ............. *H03G 3/004* (2013.01); *G01R 21/06* (2013.01); *G01R 27/2611* (2013.01); *G06F 1/3203* (2013.01); *H02M 3/158* (2013.01); *H03F 3/187* (2013.01); *H03F 3/2175* (2013.01)

(58) Field of Classification Search
CPC .... H02M 3/158; H02M 3/156; H02M 3/1582; G01R 21/06; G01R 27/2611; G06F 1/3203; H03G 3/004; G05F 1/462
See application file for complete search history.

(56) References Cited

U.S. PATENT DOCUMENTS 6,087,816 A * 7/2000 Volk ................... H02M 3/1582
                                                                          323/222
6,952,093 B1   10/2005 Broach et al.
(Continued)

OTHER PUBLICATIONS

Crump et al. ,TPA2013D1 Boost Converter Component Selection, 2009.*

(Continued)

*Primary Examiner* — John Breene
*Assistant Examiner* — Mohammad Islam
(74) *Attorney, Agent, or Firm* — Norton Rose Fulbright US LLP (57) ABSTRACT

A controller of a boost converter may be configured to dynamically adjust conditions within the boost converter by monitoring conditions in the boost converter. For example, the controller may determine an current inductance value for an inductor of the boost converter by monitoring a current through the inductor. When the inductance value of the inductor is known, a slope compensation value may be used in determining a transition time between charging the inductor of the boost converter and discharging the inductor.

16 Claims, 4 Drawing Sheets

(56) References Cited

U.S. PATENT DOCUMENTS

| | | | |
|---|---|---|---|
| 7,265,530 B1* | 9/2007 | Broach | H02M 3/156 |
| | | | 324/117 R |
| 7,425,819 B2 | 9/2008 | Isobe | |
| 7,737,668 B2 | 6/2010 | Oswald et al. | |
| 7,898,825 B2 | 3/2011 | Mulligan et al. | |
| 8,278,899 B2* | 10/2012 | Schafmeister | H02M 3/156 |
| | | | 323/283 |
| 8,525,502 B2 | 9/2013 | Weinstein et al. | |
| 8,643,436 B2* | 2/2014 | Ni | H03F 3/217 |
| | | | 330/207 A |
| 2005/0168198 A1 | 8/2005 | Maksimovic et al. | |
| 2006/0284607 A1* | 12/2006 | Isobe | H02M 3/156 |
| | | | 323/282 |
| 2009/0010035 A1 | 1/2009 | Williams | |
| 2009/0054023 A1 | 2/2009 | Bean et al. | |
| 2011/0018507 A1* | 1/2011 | McCloy-Stevens | H02M 3/1588 |
| | | | 323/271 |
| 2011/0109283 A1 | 5/2011 | Kapels et al. | |
| 2011/0115458 A1 | 5/2011 | Schafmeister et al. | |
| 2011/0199062 A1* | 8/2011 | Singnurkar | H02M 3/1582 |
| | | | 323/282 |
| 2012/0182001 A1 | 7/2012 | Huang et al. | |
| 2012/0274295 A1* | 11/2012 | Lin | H02M 3/1582 |
| | | | 323/282 |
| 2013/0057529 A1 | 3/2013 | Lee et al. | |
| 2013/0069613 A1 | 3/2013 | Nakase et al. | |
| 2013/0100711 A1* | 4/2013 | Langeslag | H02M 3/33507 |
| | | | 363/21.12 |
| 2013/0127530 A1 | 5/2013 | Ni et al. | |
| 2013/0257533 A1 | 10/2013 | Krabbenborg et al. | |
| 2014/0070728 A1* | 3/2014 | Pflaum | H02M 3/156 |
| | | | 315/307 |
| 2014/0125303 A1 | 5/2014 | Dagan et al. | |
| 2014/0270240 A1 | 9/2014 | Solomon et al. | |
| 2014/0347027 A1 | 11/2014 | Jayaraj et al. | |

OTHER PUBLICATIONS

International Search Report and Written Opinion dated Nov. 21, 2014, during examination of PCT/US2014/047624.

* cited by examiner

BOOST CONVERTER CONTROLLER WITH INDUCTANCE VALUE DETERMINATION

This application claims benefit of priority to U.S. Provisional Patent No. 61/858,939 to Ullas Pazhayaveetil et al. filed on Jul. 26, 2013 and entitled "Methods and Apparatuses for Digitally Regulated Peak Current Mode Controlled Boost Converter with Dynamic Level Adjustment," which is hereby incorporated by reference.

FIELD OF THE DISCLOSURE

The instant disclosure relates to an audio amplifier. In particular, the instant disclosure relates to power converters for audio amplifiers.

BACKGROUND

Portable devices are becoming more common in every aspect of our lives and affect how we interact with our music. For example, many consumers listen to their music from portable audio players, such as MP3 players or their cellular phones. These portable devices become easier and more enjoyable to use when the portable devices shrink in size while offering the same capabilities and when the portable devices can last longer from a single battery charge. To support longer lasting devices, the operating voltage of the components inside the portable device is often reduced to reduce power consumption by these components. However, a reduction in operating voltage affects the sound output of the portable device because the volume level of an audio signal output to a speaker is proportional to the output voltage. Thus, boost converters have been used to increase operating voltages for select components within a portable device that benefit from higher voltages, such as the audio amplifier that needs high voltages to generate high volumes.

Figure 1:
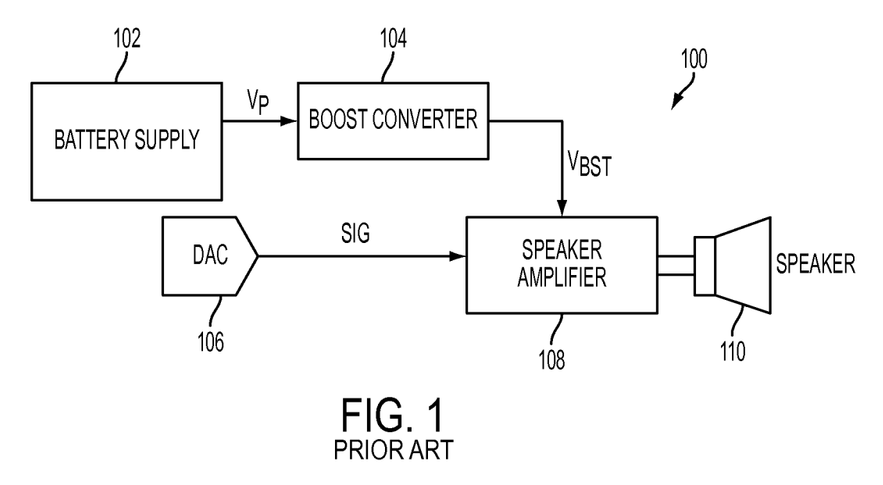
FIG. 1 is a conventional audio amplifier with a boost converter.

FIG. 1 is a conventional audio amplifier with a boost converter. An audio amplifier 100 for a mobile device includes a battery supply 102 that provides a voltage, $V_p$, to a boost converter 104. The boost converter 104 increases the voltage $V_p$ to a boost voltage, $V_{bst}$. A speaker amplifier 108 receives the boost voltage, $V_{bst}$, and an analog audio signal, sig, from a digital-to-analog converter (DAC) 106. The speaker amplifier 108 increases the low power signal of the audio signal, sig, with power received from the boost converter 104 to generate a signal to drive a speaker 110. The boost voltage, $V_{bst}$, is higher than the supply voltage, $V_p$, which allows the speaker amplifier 108 to provide louder volume ranges through the speaker 110 than possible with only the supply voltage, $V_p$.

However, providing the boost voltage, $V_{bst}$, to the speaker amplifier 108 has drawbacks, such as increased power consumption. That is, because the speaker amplifier 108 is receiving the boost voltage, $V_{bst}$, even if volume levels are low, then the speaker amplifier 108 is wasting power. This wasted power shortens the operating time of a portable device between charges and hurts the user's experience with the portable device. Additional inefficiencies exist, such as undesirable power consumption and transients that occur when the speaker 110 is connected and disconnected from the speaker amplifier 108 while the amplifier 108 is receiving the boosted voltage, $V_{bst}$. Further, the increased power consumption by the speaker amplifier 108 may cause thermal management problems. Particularly as portable devices shrink in size and have less space for heat dissipation, the speaker amplifier 108 may be constrained in volume ranges it can provide by heat buildup in the speaker amplifier 108 or the boost converter 104. Each of these shortcomings is due to the static nature of the boost voltage, $V_{bst}$, provided to the speaker amplifier 108.

Shortcomings mentioned here are only representative and are included simply to highlight that a need exists for improved audio amplifiers, particularly for consumer-level devices. Embodiments described here address certain shortcomings but not necessarily each and every one described here or known in the art.

SUMMARY

A controller of a boost converter may be configured to dynamically adjust conditions within the boost converter by monitoring conditions in the boost converter. For example, the controller may determine a current inductance value for an inductor of the boost converter by monitoring a current through the inductor. When the current inductance value of the inductor is known, a slope compensation value may be used in determining a transition time between charging the inductor of the boost converter and discharging the inductor.

In one embodiment, a method may include measuring a current through an inductor of a boost converter; determining, in a digital controller, an inductance value of the inductor based, at least in part, on the measured current; and/or determining a slope compensation for the inductor based, at least in part, on the determined inductance value, wherein the slope compensation is proportional to the determined inductance.

In some embodiments, the method may also include determining an approximate time the current through the inductor will reach a peak current level; toggling between charging the inductor and discharging the inductor before the approximate time; determining, in the digital controller, a second inductance value of the inductor at a different time than the determined first inductance value based, at least in part, on a second measured current through the inductor; updating the determined slope compensation based, at least in part, on the second determined inductance value; and/or calibrating the determined inductance value to an initial inductance value.

In certain embodiments, the step of determining may include calculating a propagation delay in toggling between charging the inductor and discharging the inductor; and/or the step of determining the slope compensation comprises determining a slope compensation from the equation: $0.5 * K_{CM} * (V_{bst} - V_P)/L_{boost}$, wherein $K_{CM}$ is a gain value, $V_{bst}$ is the boost voltage, $V_P$ is a supply voltage, and $L_{boost}$ is the inductance value of the inductor.

In another embodiment, an apparatus may include a boost converter comprising an inductor and configured to generate a boost voltage from a supply voltage; and/or a controller coupled to the boost converter and configured to measure an inductance value of the inductor, and to determine a slope compensation for the inductor based, at least in part, on the determined inductance, wherein the slope compensation is proportional to the determined inductance.

In some embodiments, the boost converter may include a boost voltage output node coupled to the inductor; a p-channel field effect transistor (PFET) coupled to the inductor and configured to couple the inductor to the boost voltage output node; and an n-channel field effect transistor (NFET) coupled to the inductor and configured to couple the inductor to a ground, wherein the controller is configured to calculate a propagation delay in toggling the PFET and the NFET.

In some embodiments, the apparatus may also include a current measurement circuit coupled to the inductor; a digital-to-analog converter (DAC) coupled to the current measurement circuit and coupled to the controller, wherein the controller may be configured to determine the inductance value by reading the digital-to-analog converter (DAC); and/or an n-channel field effect transistor (NFET) coupled to the inductor and configured to couple the inductor to a ground, wherein the current measurement circuit includes a current mirror coupled to the n-channel field effect transistor (NFET).

In certain embodiments, the controller may be further configured to determine an approximate time a current through the inductor will reach a peak current level; the controller may be configured to toggle the NFET and the PFET before the approximate time; the controller may be configured to determine the slope compensation based on the equation $0.5*K_{CM}*(V_{bst}-V_P)/L_{boost}$, wherein $K_{CM}$ is a gain value, $V_{bst}$ is the boost voltage, $V_P$ is a supply voltage, and $L_{boost}$ is the inductance value of the inductor; the controller may be configured to determine a second inductance value of the inductor at a different time than the determined first inductance value based, at least in part, on a second measured current through the inductor; and/or the controller may be configured to update the determined slope compensation based, at least in part, on the second determined inductance value.

In yet another embodiment, an integrated circuit may include an audio input node configured to receive an audio signal; a supply input node configured to receive a supply voltage; a boost converter coupled to the supply input node, comprising an inductor, and configured to output a boost voltage higher than the supply voltage; and/or a boost converter controller coupled to the boost converter. The boost converter may be configured to measure a current through the inductor; to determine an inductance value of the inductor based, at least in part, on the measured current; and/or to determine a slope compensation for the inductor based, at least in part on the determined inductance value, wherein the slope compensation is proportional to the determined inductance.

In some embodiments, the integrated circuit may also include a boost voltage output node coupled to the inductor and configured to output the boost voltage; an n-channel field effect transistor (NFET) coupled to the inductor and configured to couple the inductor to a ground; and a p-channel field effect transistor (PFET) coupled to the inductor and configured to couple the inductor to the boost voltage output node, wherein the controller may be configured to determine an approximate time the current through the inductor will reach a peak current level and configured to toggle the NFET and the PFET before the approximate time.

In certain embodiments, the controller may be configured to measure a second inductance value of the inductor at a second time; the controller may be configured to determine a slope compensation for the inductor based, at least in part, on the determined second inductance value; and/or the controller may be configured to determine the slope compensation based on the equation $0.5*K_{CM}*(V_{bst}-V_P)/L_{boost}$, wherein $K_{CM}$ is a gain value, $V_{bst}$ is the boost voltage, $V_P$ is a supply voltage, and $L_{boost}$ is the inductance value of the inductor.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
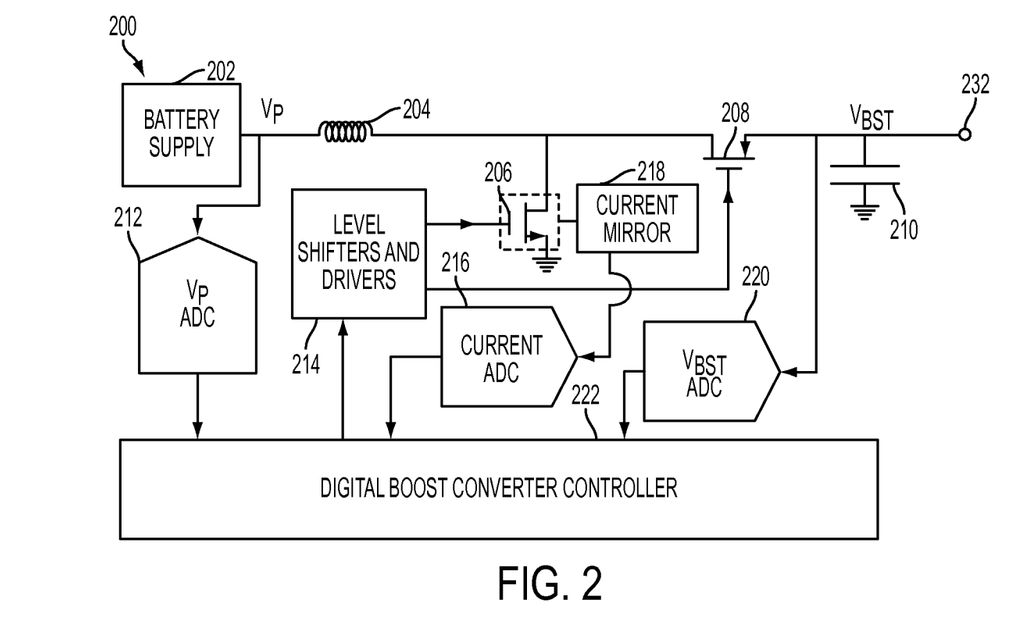
FIG. 2 is a block diagram of an audio amplifier with a dynamically-controlled boost converter according to one embodiment of the disclosure.

FIG. 2 is a block diagram of an audio amplifier with a dynamically-controlled boost converter according to one embodiment of the disclosure. A circuit 200 may include a battery supply 202, which provides a voltage, $V_p$, to the circuit 200. The circuit 200 may also include an inductor 204, with an inductance value, $L_{boost}$, coupled to an n-channel field effect transistor (NFET) 206, a p-channel field effect transistor (PMOS) 208, and a capacitor 210, having a capacitance value $C_{boost}$.

The configuration of the components 204, 206, 208, and 210 allow a digital boost converter controller 222 to generate a boost voltage, $V_{bst}$, higher than the supply voltage, $V_p$. For example, during a first time period the NFET 206 may be switched on to a conducting state to couple the inductor 204 with ground, while the PFET 208 is switched off to a non-conducting state. This causes the supply voltage, $V_p$, to be placed across the inductor 204, current to flow through the inductor 204, and energy to be stored in the inductor 204. Then, during a second time period the NFET 206 may be switched off to a non-conducting state while the PFET 208 is switched on to a conducting state. This causes the inductor 204 to couple to ground through the capacitor 210. Thus, energy stored in the inductor 204 is transferred to the capacitor 210. As energy is stored in the capacitor 210, the voltage across the capacitor 210 increases and allows the boost voltage, $V_{bst}$, at output node 232 to increase beyond the supply voltage, $V_p$. An audio amplifier (not shown) may be coupled to the output node 232 to receive the boosted voltage, $V_{bst}$. The controller 222 may control operation of the NFET 206 and the PFET 208 to control a duration of the first time period and the second time period, which regulates the transfer of power from the inductor 204 to the capacitor 210 and thus regulates the level of the boost voltage, $V_{bst}$.

The controller 222 may receive one or more inputs that provide information to allow the controller 222 to control operation of the circuit 200. For example, the controller 222 may be coupled to an analog-to-digital converter (ADC) 212 that provides the controller 222 with information about the voltage level of the supply voltage, $V_P$. In another example, the controller 222 may be coupled to an analog-to-digital converter (ADC) 216 that provides the controller 222 with information about a current level through the inductor 204. The ADC 216 may determine the current through the inductor 204 through a current mirror 218 coupled to the NFET 206. In yet another example, an analog-to-digital converter (ADC) 220 may be coupled to the controller 222 to provide information about the boost voltage, $V_{bst}$, level.

The circuit 200 may allow the controller 222 to control the boost converter through various inputs to the controller 222 and logic implemented in the controller 222. In comparison, the conventional audio amplifier with boost converter of FIG. 1 described above provides only a static boost voltage to the speaker amplifier, which leads to low efficiency and poor response to changing conditions. In one embodiment, the controller 222 may estimate an inductance value, $L_{boost}$, for the inductor 204 to monitor operating conditions of the inductor 204 and control the boost converter in the event of changes to the inductor 204.

The inductance value, $L_{boost}$, of inductor 204 may vary with the value of current, $I_{boost}$, passing through the inductor 204. Additionally, energy-storage characteristics of the inductor 204 change when the inductor 204 approaches or operates near or in saturation. In one embodiment, the controller 222 may measure inductor current through the current mirror 218 and the current analog-to-digital converter (ADC) 216. The current mirror 218 mirrors a current through the NFET 206, which is the current through the inductor 204. The ADC 216 then converts the analog value of current through the inductor 204 to a digital value for processing by the controller 222. The controller 222 may then determine a duration of a first time period for building current in the inductor 204 and duration of a second time period for discharging current to the capacitor 210 based on the known current in the inductor 204.

Figure 3:
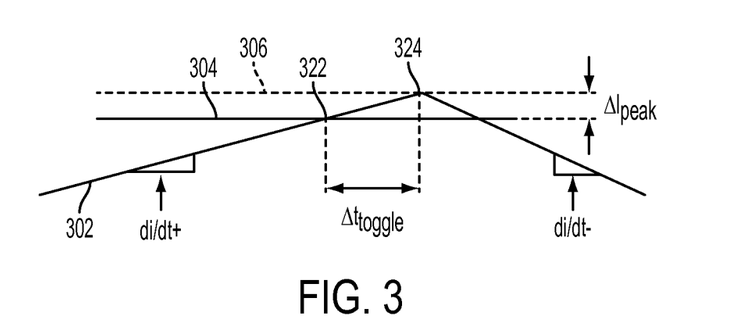
FIG. 3 is a graph illustrating estimation of an inductance value in a boost converter according to one embodiment of the disclosure.

FIG. 3 is a graph illustrating estimation of an inductance value in a boost converter according to one embodiment of the disclosure. The controller 222 may determine the transition time from the first time period to the second time period when the NFET 206 turns off and the PFET 208 turns on based on when the measured current, $I_{boost}$, shown as line 302 crosses either a slope-compensated signal or a fixed upper limit shown as line 304. After the controller 222 decides to toggle the NFET 206 and the PFET 208, control signals from the controller 222 propagate through the level shifters and drivers 214 before driving the gates of the NFET 206 and PFET 208. During this propagation delay, $\Delta t_{toggle}$, the inductor current, $I_{boost}$, continues to rise, which causes an error in the peak-current, $\Delta I_{peak}$, detected by the current mirror 218. This error value may be computed as a difference between the inductor current, shown in line 302, at the time of the control signal generation, indicated as cross point 322 and the actual value of the inductor current when the NFET 206 and the PFET 208 actually switch at point 324.

The up-slope of the inductor current of line 302 may be defined by $$\frac{di^+}{dt} = K_{CM} * \frac{V_P}{L_{boost}},$$

and a down-slope of the inductor current of line 302 may be defined by $$\frac{di^-}{dt} = K_{CM} * \frac{V_{bst} - V_P}{L_{boost}},$$

where $L_{boost}$ is the inductance value, and $K_{CM}$ is the gain value of the current measurement path including the current mirror 218. The lines 302 and 304 cross at point 322 at time $t_1$ at a current value $P_1$. After the propagation delay ($\Delta t_{toggle}$), the inductor current stops rising at time $t_2$ at a current value $P_2$. The error in the actual peak value of the inductor current is $\Delta I_{peak}$. When calculated from the up-slope of line 302, $\Delta I_{peak}$ may be calculated as $$\Delta I_{peak} = \left(K_{CM} * \frac{V_P}{L_{BOOST}}\right) * \Delta t_{toggle}.$$

Because $\Delta t_{toggle}$ is relatively constant, $V_P$ is measured and provided to the controller 222 through the analog-to-digital converter (ADC) 212, and $K_{CM}$ is known, $\Delta I_{peak}$ is directly affected by the value of $L_{boost}$. The error injected by $\Delta I_{peak}$ may be calculated and calibrated out if the value of $L_{boost}$ is known. In one embodiment, an amount of slope-compensation of line 304 for stability may be calculated as approximately at least half the down-slope of the line 302, given by $$\text{Slope Compensation} = 0.5 * \frac{di}{dt} = 0.5 * K_{CM} * \frac{V_{BST} - V_P}{L_{BOOST}},$$

where $V_P$ and $V_{bst}$ are measured and provided to the controller 222, and $K_{CM}$ is known. If $L_{boost}$ varies, a variation in the slope compensation may occur, which could lead to insufficient slope compensation and instability due to, for example, sub-harmonic oscillation. However, the $L_{boost}$ value may be determined by the controller 222 and used to improve the slope-compensation. Without an $L_{boost}$ value, a worst-case slope compensation value may be used that is not optimal for many operating conditions. Additionally, if the controller 222 recognizes that the value of $L_{boost}$ is decreasing, the controller 222 may adjust slope-compensation to counter the effect of an increased slope-compensation requirement.

Changes in $L_{boost}$ with changing inductor current may thus be compensated for by calculating the $L_{boost}$ value, knowing a starting value of $L_{boost}$, calibrating its effect out initially, and then comparing a slope of the line 302 with a calculated value of the slope. Thus, changes in $L_{boost}$, such as due to variations in current and operation at or near saturation, may be compensated.

In one embodiment, an inductance $L_{boost}$ estimator may be integrated with the controller 222, to improve slope-compensation calculation, which may improve system stability, and to accurately determine peak current, which may improve absolute current accuracy and may prevent the inductor 204 from operating in saturation.

An initial calibration may be performed to determine when calculated inductance values, $L_{boost}$, change. First, a known value of current may be forced through the inductor 204 and through the NFET 206, and thus through the current mirror 218. This known value of current may be used by the controller 222 to calibrate the current ADC 216 and the current mirror 218. Then, the boost converter may be operated with no load while samples of the current ADC 216 are taken by the controller 222 to establish a baseline inductance value from $$L_{BOOST} = VP \Big/ \left(\frac{di}{dt}\right),$$

where di is the difference between the current ADC 216 samples, and dt is the sampling period of the ADC 216. An initial $\Delta I_{peak}$ and slope compensation value may be calculated from these initial measurements and stored by the controller 222. During normal operation, this baseline $L_{boost}$ value may be repeatedly compared with newly-calculated values of $L_{boost}$. A change between the current value of $L_{boost}$ and the initial value of $L_{boost}$ may cause the controller 222 to update $\Delta I_{peak}$ and the slope compensation values as described in the calculations above.

During saturation, the earlier $\Delta I_{peak}$ equation may not be valid because the inductor waveform may depart from its expected saw-tooth signature for a peaking waveform that is non-linear at the tips. According to some embodiments, the controller 222 may detect when saturation occurs and prevent saturation by reducing the current load, and consequently the current draw, thereby bringing the inductor 204 out of saturation and back into linear operation.

Figure 4:
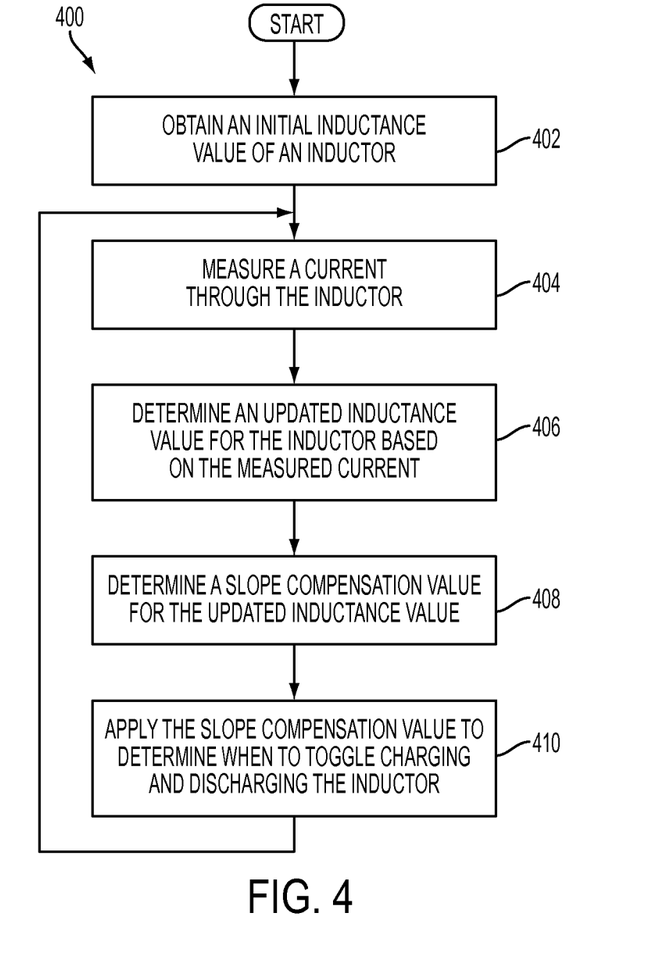
FIG. 4 is a flow chart illustrating a method of estimating an inductance value and modifying boost converter operation in response to changes in inductance value according to one embodiment of the disclosure.

FIG. 4 is a flow chart illustrating a method of estimating an inductance value and modifying boost converter operation in response to changes in inductance value according to one embodiment of the disclosure. A method 400 may begin at block 402 with obtaining an initial inductance value of an inductor of a boost converter. Block 402 may be performed, for example, during a start-up procedure before audio is output from an audio amplifier. At block 404, a current through the inductor is measured by the controller during operation of the boost converter, such as while the boost converter and audio amplifier are amplifying an audio signal.

At block 406, an updated inductance value for the inductor of the boost converter may be determined by the controller based on the measured current of block 404. The updated inductance value may indicate changes in the inductance value that are caused by, for example, operation at or near saturation or other conditions. At block 408, when the updated inductance value of block 404 differs from the initial inductance value of block 402, an updated slope compensation value may be calculated for the updated inductance value of block 406. The updated slope compensation value may be calculated from $$\text{Slope Compensation} = 0.5 * \frac{di}{dt} = 0.5 * K_{CM} * \frac{V_{BST} - V_P}{L_{BOOST}},$$

wherein $K_{CM}$ is a gain value, $V_{bst}$ is the boost voltage, $V_P$ is a supply voltage, and $L_{boost}$ is the inductance value of the inductor.

The updated slope compensation value of block 408 may be applied, at block 410, to determine when to toggle charging and discharging of the inductor. For example, the controller may calculate an approximate time the current through the inductor will reach a peak current level by calculating a toggle delay in toggling the NFET and PFET of the boost converter. The controller may then toggle the NFET and PFET in advance of the time the inductor would reaches the peak current level, taking into account the toggle delay, to reduce damage to the inductor and undesirable effects output by the audio amplifier when saturation is reached. The method 400 executing in the controller may return to block 404 to repeatedly, continuously, periodically, or occasionally measure a current through the inductor and update the calculated inductance value at block 406 and slope compensation value at block 408.

As described above, an initial calibration and storage of the inductance, $L_{boost}$, in conjunction with periodic or occasional re-evaluation of the inductance value, $L_{boost}$, by using, for example, the measured supply voltage, $V_P$, by the ADC 212 and the measured boost current by the ADC 216 allows the controller 222 to monitor changes in the inductance value, $L_{boost}$. A sudden drop in this value, such as approximately a 30 to 80% change, may be indicative of reaching saturation or sudden inductor current spiking, which may cause damage to the inductor 204 and/or the boost converter. This information may be used by the controller 222 to control the audio amplifier and/or the boost converter to reduce the load and prevent damage to both the inductor and the boost converter. Additionally, the controller 222 may dynamically adjust slope compensation to better stabilize the system, as well as increasing the accuracy of detected peak inductor current levels. For example, slope compensation may be adjusted between approximately −70 and +80 percent during a span of approximately 3-10 microseconds.

If implemented in firmware and/or software, the operations described above, such as with reference to FIG. 4, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   measuring a current through an inductor of a boost converter;
   determining, in a digital controller, an inductance value of the inductor based, at least in part, on the measured current;
   determining a slope compensation for the inductor based, at least in part, on the determined inductance value, wherein the step of determining the slope compensation comprises determining a slope compensation based on a gain value, a boost voltage, a supply voltage, and the inductance value of the inductor;
   determining a time the current through the inductor will reach a peak current level based, at least in part, on the determined inductance value, wherein the step of determining the time comprises calculating a propagation delay in toggling between charging the inductor and discharging the inductor; and
   toggling between charging the inductor and discharging the inductor before the time to control a level of a boost voltage output by the boost converter.

2. The method of claim 1, wherein the step of determining the slope compensation comprises determining a slope compensation from the equation:

$$0.5 * K_{CM} * (V_{bst} - V_P) / L_{boost},$$

wherein $K_{CM}$ is the gain value, $V_{bst}$ is the boost voltage, $V_P$ is the supply voltage, and $L_{boost}$ is the inductance value of the inductor.

3. The method of claim 1, further comprising:
   determining, in the digital controller, a second inductance value of the inductor at a different time than the determined first inductance value based, at least in part, on a second measured current through the inductor; and
   updating the determined slope compensation based, at least in part, on the second determined inductance value.

4. The method of claim 1, further comprising calibrating the determined inductance value to an initial inductance value.

5. An apparatus, comprising:
   a boost converter comprising an inductor and configured to generate a boost voltage from a supply voltage; and
   a controller coupled to the boost converter and configured to:
      measure an inductance value of the inductor;
      determine a slope compensation for the inductor based, at least in part, on the determined inductance, wherein the slope compensation is proportional to the determined inductance, wherein the step of determining the slope compensation comprises determining a slope compensation based on a gain value, the boost voltage, the supply voltage, and the inductance value of the inductor;
      determining a time a current through the inductor will reach a peak current level based, at least in part, on the determined inductance value, wherein the step of determining the time comprises calculating a propagation delay in toggling between charging the inductor and discharging the inductor; and
      toggling between charging the inductor and discharging the inductor before the time to control a level of a boost voltage output by the boost converter.

6. The apparatus of claim 5, wherein the boost converter further comprises:
   a boost voltage output node coupled to the inductor;
   a p-channel field effect transistor (PFET) coupled to the inductor and configured to couple the inductor to the boost voltage output node; and
   an n-channel field effect transistor (NFET) coupled to the inductor and configured to couple the inductor to a ground,
   wherein the controller is configured to calculate a propagation delay in toggling the PFET and the NFET.

7. The apparatus of claim 6, wherein the controller is configured to toggle the NFET and the PFET before the time.

8. The apparatus of claim 5, wherein the controller is configured to determine the slope compensation based on the equation:

$$0.5 * K_{CM} * (V_{bst} - V_P) / L_{boost},$$

wherein $K_{CM}$ is the gain value, $V_{bst}$ is the boost voltage, $V_P$ is the supply voltage, and $L_{boost}$ is the inductance value of the inductor.

9. The apparatus of claim 8, wherein the controller is further configured to:
   determine a second inductance value of the inductor at a different time than the determined first inductance value based, at least in part, on a second measured current through the inductor; and
   update the determined slope compensation based, at least in part, on the second determined inductance value.

10. The apparatus of claim 5, further comprising:
    a current measurement circuit coupled to the inductor; and
    a digital-to-analog converter (DAC) coupled to the current measurement circuit and coupled to the controller,
    wherein the controller is configured to determine the inductance value by reading the digital-to-analog converter (DAC).

11. The apparatus of claim 10, further comprising:
    an n-channel field effect transistor (NFET) coupled to the inductor and configured to couple the inductor to a ground,
    wherein the current measurement circuit comprises a current mirror coupled to the n-channel field effect transistor (NFET).

12. An integrated circuit, comprising:
    an audio input node configured to receive an audio signal;
    a supply input node configured to receive a supply voltage;
    a boost converter coupled to the supply input node, comprising an inductor, and configured to output a boost voltage higher than the supply voltage;
    a boost converter controller coupled to the boost converter and configured to:
       measure a current through the inductor;
       determine an inductance value of the inductor based, at least in part, on the measured current;
       determine a slope compensation for the inductor based, at least in part on the determined inductance value, wherein the slope compensation is proportional to the determined inductance, wherein the step of determining the slope compensation comprises determining a slope compensation based on a gain value, the boost voltage, the supply voltage, and the inductance value of the inductor;

determining a time the current through the inductor will reach a peak current level based, at least in part, on the determined inductance value, wherein the step of determining the time comprises calculating a propagation delay in toggling between charging the inductor and discharging the inductor; and toggling between charging the inductor and discharging the inductor before the time to control a level of a boost voltage output by the boost converter.

13. The integrated circuit of claim 12, wherein the boost converter controller is configured to determine the slope compensation based on the equation:

$$0.5 * K_{CM} * (V_{bst} - V_P) / L_{boost},$$

wherein $K_{CM}$ is the gain value, $V_{bst}$ is the boost voltage, $V_P$ is the supply voltage, and $L_{boost}$ is the inductance value of the inductor.

14. The integrated circuit of claim 12, wherein the boost converter further comprises:
a boost voltage output node coupled to the inductor and configured to output the boost voltage;
an n-channel field effect transistor (NFET) coupled to the inductor and configured to couple the inductor to a ground; and
a p-channel field effect transistor (PFET) coupled to the inductor and configured to couple the inductor to the boost voltage output node,
wherein the controller is configured to determine the time the current through the inductor will reach a peak current level and configured to toggle the NFET and the PFET before the time.

15. The integrated circuit of claim 12, wherein the controller is further configured to:
measure a second inductance value of the inductor at a second time; and
determine a slope compensation for the inductor based, at least in part, on the determined second inductance value.

16. An apparatus, comprising:
a boost converter comprising an inductor and configured to generate a boost voltage from a supply voltage, wherein the boost converter further comprises:
a boost voltage output node coupled to the inductor;
a p-channel field effect transistor (PFET) coupled to the inductor and configured to couple the inductor to the boost voltage output node; and
an n-channel field effect transistor (NFET) coupled to the inductor and configured to couple the inductor to a ground,
wherein the controller is configured to calculate a propagation delay in toggling the PFET and the NFET; and
a controller coupled to the boost converter and configured to:
measure an inductance value of the inductor;
determine a slope compensation for the inductor based, at least in part, on the determined inductance, wherein the slope compensation is proportional to the determined inductance, wherein the boost converter controller is configured to determine the slope compensation based on the equation:

$$0.5 * K_{CM} * (V_{bst} - V_P) / L_{boost},$$

wherein $K_{CM}$ is the gain value, $V_{bst}$ is the boost voltage, $V_P$ is the supply voltage, and $L_{boost}$ is the inductance value of the inductor;

determining a time a current through the inductor will reach a peak current level based, at least in part, on the determined inductance value, wherein the step of determining the time comprises calculating a propagation delay in toggling between charging the inductor and discharging the inductor; and toggling between charging the inductor and discharging the inductor before the time to control a level of a boost voltage output by the boost converter, wherein the controller is configured to toggle the NFET and the PFET before the time.

* * * * *